US011022646B2

(12) United States Patent
Schmidt

(10) Patent No.: US 11,022,646 B2
(45) Date of Patent: *Jun. 1, 2021

(54) METHOD AND SYSTEM FOR RESOLVING HOT SPOTS IN LIT

(71) Applicant: FEI EFA, Inc., Fremont, CA (US)

(72) Inventor: Christian Schmidt, Halle (DE)

(73) Assignee: FEI EFA, Inc., Fremont, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/716,370

(22) Filed: Dec. 16, 2019

(65) Prior Publication Data

US 2020/0116782 A1 Apr. 16, 2020

Related U.S. Application Data

(63) Continuation of application No. 14/913,961, filed as application No. PCT/US2014/052390 on Aug. 22, 2014, now Pat. No. 10,545,186.

(30) Foreign Application Priority Data

Aug. 23, 2013 (EP) .................... 13181512

(51) Int. Cl.
*G01R 31/308* (2006.01)
*H02S 50/10* (2014.01)
(Continued)

(52) U.S. Cl.
CPC ....... *G01R 31/308* (2013.01); *G01R 31/2635* (2013.01); *G01R 31/311* (2013.01);
(Continued)

(58) Field of Classification Search
CPC .............. G01R 31/308; G01R 31/027; G01R 31/2635; G01R 31/311; G01R 31/3627; H02S 50/10
(Continued)

(56) References Cited

U.S. PATENT DOCUMENTS 10,454,186 B2  10/2019  Boyanov et al.
10,545,186 B2   1/2020  Schmidt
(Continued)

FOREIGN PATENT DOCUMENTS

JP  2008-545232 A  12/2008
JP  2012-512419 A   5/2012
JP  2013-526723 A   6/2013

OTHER PUBLICATIONS

Schmidt et al.; "Non-destructive defect depth determination at fully packaged and stacked die devices using Lock-in Thermography"; Jul. 29, 2010; IEEE; 2010 17th IEEE International Symposium on the Physical and Failure Analysis of Integrated Circuits (Year: 2010).*

(Continued)

*Primary Examiner* — Nasima Monsur
*Assistant Examiner* — Rahul Maini
(74) *Attorney, Agent, or Firm* — Klarquist Sparkman, LLP

(57) ABSTRACT

Localizing hot spots in multi layered device under test (DUT) by using lock-in thermography (LIT) where plural hot spots of electrical circuits are buried in the DUT at different depth layers from a bottom layer to a top layer, comprises applying test signals of multiple frequencies to the electrical circuits of the DUT for exciting the hot spots; imaging a top surface of the top layer of the DUT at timed intervals to obtain IR images of the DUT while the test signal is applied to the electrical circuits wherein the images are in correlation to a propagation of heat from the hot spots in the DUT; detecting the thermal response signals at the timed intervals from the images taken from the DUT; and determining changes in the appearance of hot spot images on the top surface of the DUT in relation to the frequencies of the thermal response signals.

36 Claims, 4 Drawing Sheets

(51) Int. Cl.
*G01R 31/26* (2020.01)
*G01R 31/311* (2006.01)
*G01R 31/385* (2019.01)
*G01R 31/62* (2020.01)

(52) U.S. Cl.
CPC .......... *G01R 31/385* (2019.01); *G01R 31/62* (2020.01); *H02S 50/10* (2014.12)

(58) Field of Classification Search
USPC .................................................. 324/754.21
See application file for complete search history.

(56) References Cited

U.S. PATENT DOCUMENTS

| | | | |
|---|---|---|---|
| 2003/0010919 A1 | 1/2003 | DiMarzio et al. | |
| 2010/0073665 A1* | 3/2010 | Zhao | G01N 25/72 356/36 |
| 2010/0074515 A1* | 3/2010 | Zhao | G01N 25/72 382/149 |
| 2011/0297829 A1 | 12/2011 | Altmann et al. | |
| 2012/0098957 A1* | 4/2012 | Deslandes | G01N 25/72 348/92 |
| 2013/0269436 A1 | 10/2013 | Couse et al. | |
| 2015/0338458 A1* | 11/2015 | Deslandes | G01N 25/72 348/92 |

OTHER PUBLICATIONS

Japanese Office Action issued in JP 2016-536498 dated Jul. 3, 2018.
International Search Report and Written Opinion for PCT/US2014/052390, dated Dec. 11, 2014, 10 pages.
International Preliminary Report on Patentability for PCT/US2014/052390, dated Feb. 23, 2016.

* cited by examiner

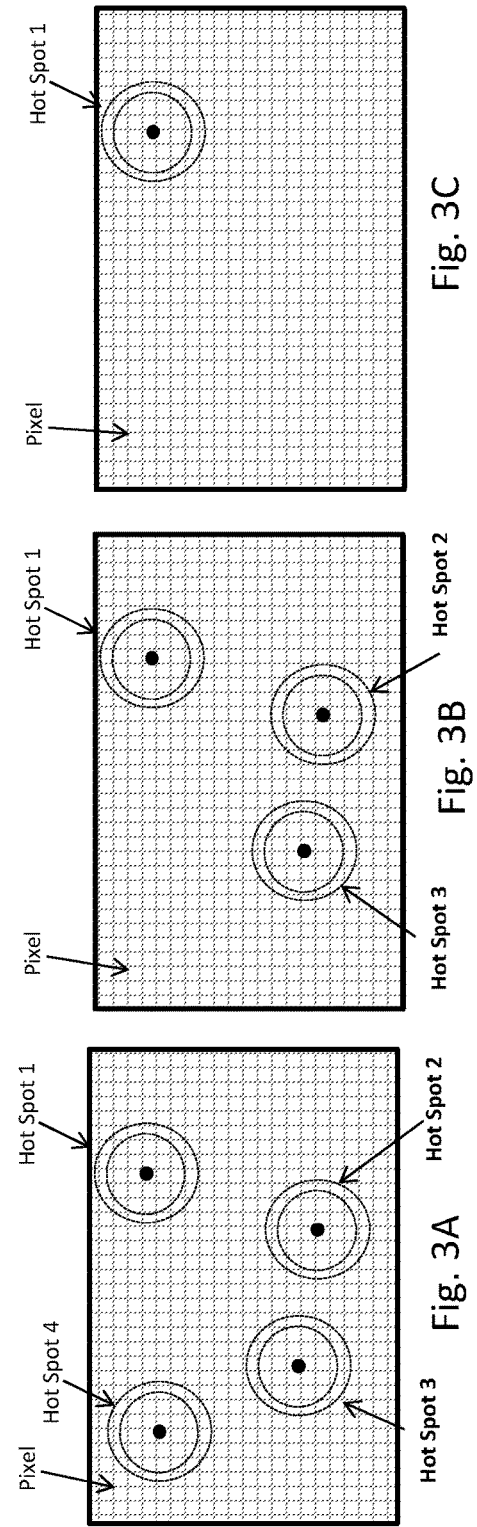
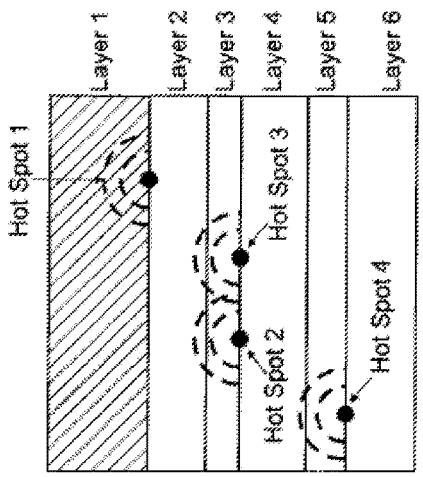
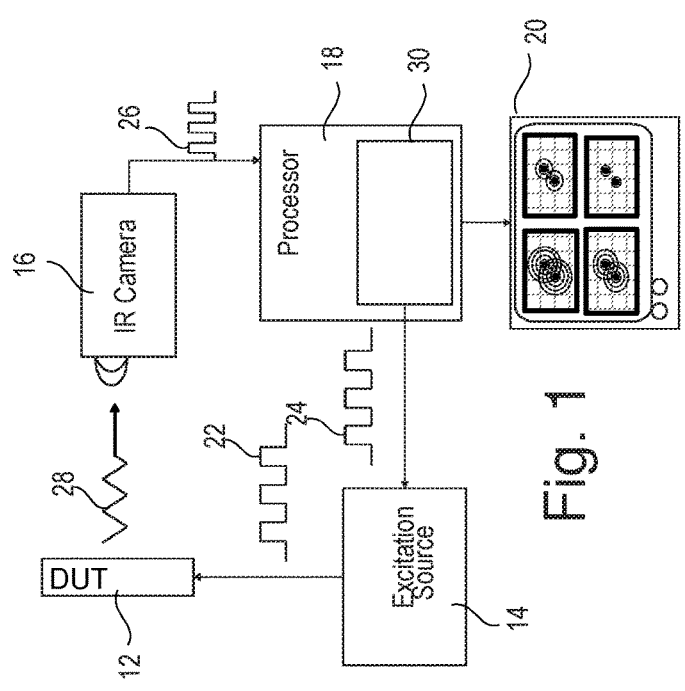

METHOD AND SYSTEM FOR RESOLVING HOT SPOTS IN LIT

CROSS REFERENCE TO RELATED APPLICATIONS

This is a Continuation of U.S. patent application Ser. No. 14/913,961, filed Feb. 23, 2016, which is the national phase of International Application No. PCT/US2014/052390, filed Aug. 22, 2014, which claims the benefit of priority to European Patent Application No. 13181512.8, filed on Aug. 23, 2013, which applications are hereby incorporated by reference in their entireties.

The invention is in the field of localizing anomalies using lock-in thermography (LIT) and, more specifically for differentiating among various detected anomalies. Specific examples relate to methods and systems for localizing and resolving anomalies in a semiconductor integrated circuit, referred to in the art as device under test (DUT), by detecting hot spots caused by anomalies in an electrical circuit buried within the DUT.

In the paper of CHRISTIAN SCHMIDT et al: "Non-destructive defect depth determination at fully packaged and stacked die devices using Lock-in Thermography", PHYSICAL AND FAILURE ANALYSIS OF INTERGRATED CIRCUITS (IPFA, 2010), proceedings 17th IEEE International Symposium on the IEEE, NJ, USA, Jul. 5, 2010 (2010 Jul. 5), pages 1 to 5, XP 031720074, ISBN 978-1-4244-5596-6, a non-destructive approach for the 3D localization of thermally active buried defects in single chip and stacked die architectures by use of lock-in thermography (LIT) is presented. The paper also describes the use of phase shift to deduce the depth of the thermally active buried defect. The basic principal concerns the thermal wave propagation through different material layers and the resulting phase shift. Based on that, the LIT application for 3D defect localization is explained and both fully packaged single chip and stacked die devices are considered while comparing the theoretical and experimental data (results).

WO 2011/156527 A1 refers to three dimensional hot spot localization by use of the lock-in thermography which can detect very small temperature variations across a sample by direct thermal imaging, using an IR sensitive camera combined with pixel-wise two channel lock-in correlation. For quantitative LIT analysis and three-dimensional location of buried heat sources, the basic principles of heat wave propagation and the dependence of the thermal and geometrical properties of the material layer(s) above the hot spot area, have to be understood. In the system and the method of WO 2011/156527 A1 test signals are applied to the sample at multiple different lock-in frequencies in order to determine the phase shift values at the various lock-in frequencies. The phase shift is the result of the thermal propagation in the material, thus is indicating of the depth in which the hot spot originated. Also, a frequency vs. phase curve is obtained, from which the depth of a defect in the sample may be determined. Such frequency vs. phase curve serves to calculate, using a mathematical model of the structure of the DUT, the exact three-dimensional location of the defect causing the hot spot. This exact localization of the defect can also serve for identifying the circuit element which caused the defect.

When testing and examining DUTs, it may be sufficient to determine the general depth location of a defect causing a hot spot, and this information can be used to design further tests and analysis of the DUT. For example, sometimes ion milling or other methods may be used to remove portions of the layered structure of the DUT to expose the defect for further imaging and/or edits. The appropriate location and depth of the milling can be determined using the hot spot localization. Furthermore, from knowing the approximate depth location of a defect, one can also postulate about the characteristics and/or cause of the defect and the general portion of the circuitry where it has occurred.

In view the state of the art as discussed above, there is a definite need for a method and a system for preliminarily determining the depth locations of hot spots in various layers in a multi layered device under test (DUT), where the hot spots of electrical circuits are buried in the DUT in layers at different depth levels. For example, one problem in the prior art is the obtainable optical resolution of the IR imaging. Specifically, if the hot spots are spatially very close to each, they may appear in the image as a single spot. Similarly, if there are two or more anomalies at different levels/depths, but one positioned over the other in a very close spatial proximity, they may also appear as a single spot. Thus, the investigator would be led to believe that a single anomaly exists and direct all attention to investigating that single anomaly, when in fact there are two or more anomalies.

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

According to an aspect of the invention, a method is provided for localizing hot spots in a multi layered device under test (DUT) by using lock-in thermography (LIT) where plural hot spots of electrical circuits are buried in the DUT at different depth layers from a bottom layer to a top layer, comprising: applying test signals of multiple frequencies to the electrical circuits of the DUT for exciting the hot spots; imaging a top surface of the top layer of the DUT at timed intervals to obtain IR images of the DUT while the test signal of one of the multiple frequencies is applied to the electrical circuits wherein the images are in correlation to a propagation of heat from the hot spots in the DUT; detecting the thermal response signal at the timed intervals from the images taken from the DUT; and determining changes in the appearance of hot spot images on the top surface of the DUT in relation to the frequencies of the test signals. As a result of this method, one can get information on how many defects there are within the various layers of the layered structure of the DUT and in which layers the defects are occurring. Such information is of advantage in determining the further procedure in testing the DUT, for example how to remove layers and which layers are to be removed first if one adds the destroying examination to the non-destructive defect examination outlined above.

According to an advantageous aspect of the invention, determining changes in the appearance of hot spot images comprises determining the timing of the disappearance of hot spot images on the surface of the DUT in relation to the frequencies of the test signals. While also certain reference intensity values could be used in order to get a result on the time needed for the thermal wave coming from a defect in the DUT takes to arrive from the defect at the surface of the DUT. However, taking the appearance of a hot spot image on the top surface of the DUT gives a well-defined point of time for determining the runtime of the heat wave from the defect of the DUT to the top surface thereof or, in other words, the depth location of the defect in the DUT. This information can be used, in an advantageous way, in order to determine the further procedure in examining the respective DUT, in particular to determine from which side of the DUT one starts with removing layer by layer in order to arrive at a particular defect to further characterize and analyze such defect.

According to an advantageous aspect of the invention, determining changes in the appearance of hot spot images comprises determining a change of an oval shaped hot spot image generated by at least two laterally closely neighboring hot spots at a certain depth level into two separate hot spot images in relation to the frequencies of the test signals. In case two defects are laterally closely neighboring to each other, the resulting thermal image on the top surface of the DUT will have an oval to almost round shape, and it is not clear from inspection of the images of the defects whether there are two defects or one defect. In order to further plan the examination of the DUT, it is very advantageous to know how many defects have caused the heat waves which finally resulted in the image to be observed by taking IR-photos from the top surface of the DUT. The method of the invention can be used in an advantageous way, to separate the images of the two hot spots by applying the test signals at multiple frequencies which results in that the separation of the hot spots gets more pronounced with increasing test signal frequencies.

According to an advantageous aspect of the invention, determining changes in the appearance of hot spot images comprises determining a change of an oval shaped hot spot image generated by at least two laterally closely neighboring hot spots at different depth levels to a separate hot spot image generated by one of the two hot spots in relation to the frequencies of the test signals. On top of the previously mentioned separation of two laterally closely neighboring hot spots, continuing with increasing the test signal frequencies finally results in that one of the two laterally closely neighboring hot spots disappears indicating that the remaining hot spot is closer to the top surface of the DUT than the hot spot which caused the image which has disappeared.

According to an advantageous aspect of the invention, the imaging at timed intervals comprises continuously averaging the live images to obtain an image of reduced signal to noise ratio (S/N). According to this feature, an image of the surface of the DUT which corresponds to end of a previous timed interval, is averaged with an image of the surface of the DUT taken at an end of a subsequent timed interval. As more images are captured, the images are continuously summarized and averaged step by step. Since the response signal stays the same, the noise is canceled out over time by this averaging process. This advantageous embodiment of the invention improves lock-in thermography method to be carried out in real time.

According to an advantageous aspect of the invention, the images of the top surface of the DUT add the points in time where the appearance of a hot spot has changed, are separately stored in an intermediate storage for subsequent display. Whereas the images as they are taken in the timed intervals are replaced after each timed interval, the stored images are the basis for a further informative display of the results of this testing method.

According to an advantageous aspect of the invention, a signal-to-noise ratio of the detected thermal response signal is determined and the presence of a hot spot is detecting where the signal-to-noise ratio of the thermal response signals is above a predetermined reference value. The signal-to-noise ratio of the thermal response signals is, in an advantageous way, a reliable measure to determine the disappearance of the image of a hot spot on the top surface of the DUT. Methods for determining signal to noise ratios of signals having a basic oval shape, like a Gauss distribution curve, and a noise portion (ripple) are well-known in the art of signal processing, and there are clear definitions how the signal-to-noise ratio is to be measured and evaluated. Therefore, the signal-to-noise ratio is an advantageous choice for defining a point of time where an image related to a hot spot is disappearing.

According to an advantageous aspect of the invention, the method further comprises displaying on a monitor the image (s) of the hot spot(s) or the timing of the disappearance of hot spot images on the to surface of the DUT in relation to the frequencies of the test signals. This gives an advantageous information to the operator enabling the operator to further control and modify the testing procedure.

According to an aspect of the invention, a system for localizing hot spots in a multi layered device under test (DUT) by using lock-in thermography (LIT) where plural hot spots of electrical circuits are buried in the DUT at different depth layers from a bottom to a top layer, comprises an excitation source to apply test signals of multiple frequencies to the electrical circuits of the DUT for exciting the plural hot spots; an infrared camera for imaging a top surface of the top layer of the DUT at timed intervals to obtain IR images of the DUT while the test signal is applied to the electrical circuits wherein the images are in correlation to a propagation of heat from the hot spots in the DUT; and a processor configured: to receive data from the infrared camera and to use the images of the infrared camera for detecting thermal response signals at the timed intervals; and to determine changes in the appearance of hot spot images on the top surface of the DUT in relation to the frequencies of the thermal response signals.

According to an advantageous aspect of the invention, the system further comprises a monitor for displaying the shape (s) of the hot spot image(s) or the timing of the disappearance of hot spot images on the to surface of the DUT in relation to the frequencies of the thermal response signals.

According to an advantageous aspect of the invention, the processor is configured to carry out the above preferred methods.

As is apparent from the discussion of the method of the invention and the advantageous embodiment thereof, the above system for localizing hot spots in a multi-layer device under test is an advantageous system for implementing the method of the invention and the advantageous embodiments thereof.

While embodiments of the invention are described herein with respect to encapsulated integrated circuits, the invention can also be implemented for testing other devices that generate hot spots by electrical stimulation, such as batteries, solar cells, power devices, LED's, etc. Therefore, the discussions relating to investigations of DUT may be applicable to these devices as well.

Further advantages, features and potential applications of the present invention may be gathered from the description which follows, in conjunction with the embodiments illustrated in the drawings.

DRAWINGS

Throughout the description, the claims and the drawings, those terms and associated reference signs will be used as are notable from the enclosed list of reference signs. The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1 shows a general outline of the system for carrying out the method according to embodiments of the invention;

FIG. 2 shows a schematic cross section of a device under test DUT having multiple layers and multiple hot spots located at different layers;

FIGS. 3A to 3C show schematic top views or IR images of hot spots of a DUT where the hot spots are at differing depth locations;

DESCRIPTION OF THE INVENTION

Figure 4A:
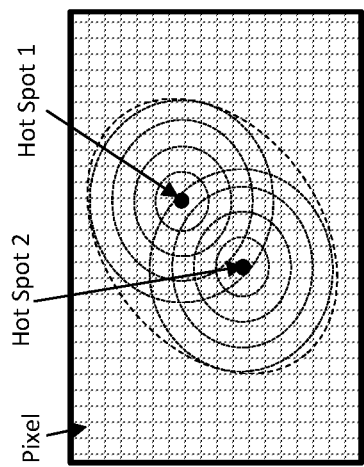
FIGS. 4A to 4D show schematic top views or IR images of another DUT having two closely neighboring hot spots on one of a plurality of layers.

In the following specification, the invention is explained with reference to a DUT, which is a specific example for the samples to which the present invention may be applied.

General System for Hot Spot Localization

FIG. 1 is a schematic illustrating a system for performing LIT and which may be used to implement the methods of the invention as described below. A device under test (DUT) 12 is stimulated by excitation signal 22 at a lock-in frequency generated by excitation source 14. The lock-in frequency of the excitation signal is set by a central processing unit 18. While general thermography may be performed using sinusoidal signal, since the DUT is a digital device, excitation signal 22 is an electrical rectangular or square wave signal designed to turn on and off various active elements, e.g., transistors, within the DUT. In both rectangular and square wave signals the amplitude alternates instantaneously between fixed maximum and minimum values, such that the frequency is the number of transitions per period, e.g., number of transitions per second.

A sync signal 24 is output from the central processing unit 18 and sent to the excitation source 14. The simplest way is to set the sync signal 24 at the desired lock-in frequency, although it may be set to a different frequency, so long as provisions are made to enable excitation source 14 to generate the excitation signal 22 at the desired lock-in frequency using the sync signal 24. As the excitation signals cause currents to flow in the DUT 12, anomalies inside the DUT 12 cause local hot spots. The heat from the hot spots then propagates inside the DUT 12 until it reaches the surface of the DUT 12, which faces IR camera 16. Then heat rays 28 outputted from the surface of the DUT 12 to IR camera 16 are used to take IR images of surface of the DUT and to output image signals 26 to the central processing unit 18 including a processor 30. The frame rate of camera 16 is usually selected taking into account the lock-in frequency. In case of a 2-channel IR camera, the frame rate of the camera is 4-times the lock-in frequency. With the setup of FIG. 1, an identification of a hot spot's spatial and depth localization within the DUT 12 is possible. The processor 30 of the setup of FIG. 1 is configured to carry out the processing required in the invention as described below.

Examples for Hot Spot Locations in Multi-Layered DUTs

FIG. 2 shows a schematic cross section of a device under test DUT having multiple layers (layer 1 to layer 6 in this example) and multiple hot spots (hot spot 1 to hot spot 4 in this example) located at different layers. The hot spots 1 to 4 in FIG. 2 are drawn up as a solid center dot corresponding to the location of the anomaly that creates the hot spot, and an area around the center dot depicted as broken lines to show the lateral diffusion of the heat originating from the center solid dot of the hot spot. As can be seen in FIG. 2, hot spot 1 is located in between layers 1 and 2, hot sports 2 and 3 are located in between layers 3 and 4 and hot spot 4 is located in between layers 5 and 6, where such hot spots regularly arise from defects in electronic circuits (not shown) in between or on top of the layers.

The method of LIT can be used to non-destructively determine the lateral and depth positions of the hot spots inside of the DUT. Lateral position is obtained from the spatial IR image, while the hot spot depth can be determined using the resulting phase shift. Specifically, as the applied signal creates current within the DUT, the current flowing through the anomalies generate hot spots, and the heat of the hot spots propagates towards the surface, as shown by the dotted-line arches around each hot spot. However, it takes time for the hot spot to appear at the surface to be imaged by the IR camera. This time delay between the illumination time and the time the hot spot appears on the surface is the phase shift that is used to determine the depth of the hot spot, taking into consideration the material properties of the different layers through which the heat has to propagate to get to the surface.

For 3D hot spot localization inside of the stack of layers 1 to 6, thermal waves generated at the hot spot position have to propagate through different material layers, e.g., silicon, mold compound, etc., each possibly having different thicknesses and different properties. As a consequence, depending on the hot spot depth position at different layers of the defective DUT, not only the distance to the surface of the DUT but also the thermal diffusion length is changing. Therefore, thermal waves generated at hot spots at lower layers inside the stack have to pass additional material layers compared to thermal waves generated at hot spots which are close to the top surface of the DUT. Various embodiments described below take advantage of this character of heat propagation in order to enable resolving two or more hot spots that may optically appear to be a single hot spot.

Normally, optical systems are limited by their inherent resolution. The resolution of a system is based on the minimum distance r at which two points can be distinguished as individuals. The full-width half half-maximum (FWHM) of the point spread function is often used to define the system's resolution, which can be approximated as r=0.4 $\lambda$/NA, wherein $\lambda$ is the wavelength and NA is the numerical aperture of the system. This poses a resolving limit on the IR camera for resolving two spatially close hot spots. As described below, various embodiments overcome this optical resolution limit by taking advantage of the heat propagation within the DUT.

FIGS. 3A to 3C show schematic top views or IR images of hot spots of a DUT where the appearance of the hot spots depends on differing lock-in frequencies. FIG. 3A shows the case of a first lock-in frequency within a low frequency range so that the thermal waves of all the hot spots 1 to 4 have sufficient time to arrive at the top surface of the DUT and are visible in the IR image. FIG. 3B shows the case of a second lock-in frequency above the first lock-in frequency of FIG. 3A. As a result of the higher frequency of the second lock-in frequency there was insufficient time for the heat from hot spot 4 to reach the surface before the second cycle commenced. Consequently, hot spot 4 does not show up in the IR image. FIG. 3C shows the case of a third the lock-in frequency, which is higher than the second lock-in frequency. In this case also the hot spots 2 and 3 disappear in the IR image, and only hot spot 1, which is close to the top surface of the DUT, is visible. Therefore, by comparing IR images taken at different excitation frequencies and noting the disappearance of hot spots with increasing lock-in frequencies, one can obtain information on the depth relationship of the hot spots within the stacked DUT. The sequence of disappearance of the hot spots in relation to the lock-in frequencies can be documented by the IR images themselves or by displaying a sequence of disappearance of the hot spots in relation to the respective lock-in frequencies.

The disappearance of the images of the hot spots at the top surface of the DUT is defined as the point of time where the signal-to-noise ratio of the thermal response signal is above a pre-determined reference value.

Figure 4B:
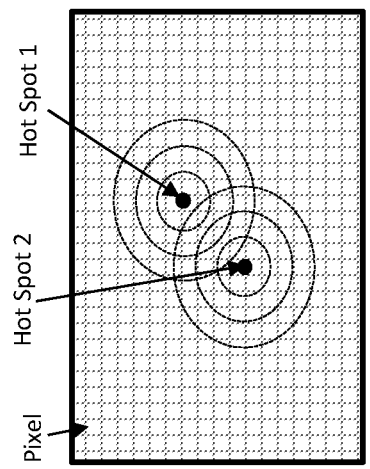
Figure 4C:
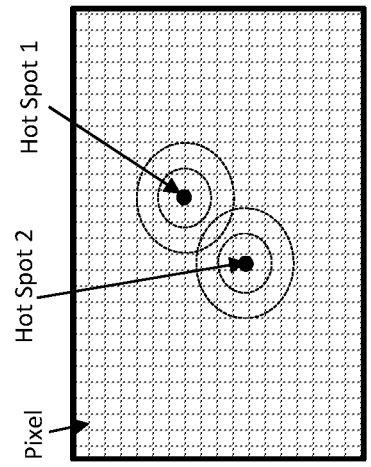
Figure 4D:
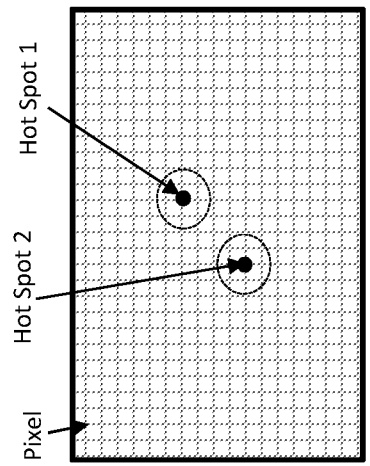

FIGS. 4A to 4D show schematic top views of IR images of another DUT having two closely neighboring hot spots in one of a plurality of layers, each Figure showing the image of excitation at different lock-in frequency. FIG. 4A shows the case where at least two hot spots are in close lateral neighboring distance to each other. The two hot spots overlap into one single oval shaped thermal response image, which is obtained at a first lock-in frequency in a low range of lock-in frequencies. The spatial separation of the two hot spot images is beyond the optical resolution of the system, such that it appears as if it was generated from a single hot spot. FIG. 4B shows the case where a second lock-in frequency is considered, which is higher than the first lock-in frequency, and results in a damping of the lateral wave propagation so that the thermal response images of the two hot spots are still partially overlapping. That is, the heat has less time to propagate laterally before the image is generated, such that the resulting image on the surface is not of a single "blob" as in FIG. 4A. Consequently, from this image of FIG. 4B, one can at least suspect that there are two hot spots and perform further investigation, as shown in FIG. 4C. FIG. 4C shows the IR image obtained with a third lock-in frequency, higher than the second lock-in frequency, which results in a further damping of the lateral wave propagation and results in a lateral separation of the thermal response images. In FIG. 4D, a fourth lock-in frequency is considered which is higher than the third lock-in frequency of FIG. 3C. Thereby, the lateral wave propagation is further dampened resulting in a clear lateral separation of the thermal response images.

Hot Spot Localization in Multi-Layered DUT

In the series of images of FIGS. 4A-4D the hot spots are generated at the same depth within the DUT. However, in case hot spots 1 and 2 are located at different depth locations within the stack of the DUT, at some frequency one of the two hot spots which are located deeper in the DUT will disappear. This will occur when the excitation lock-in frequency is such a high frequency that the heat propagation from the deeper hot spot has insufficient time to propagate to the surface before the image is obtained, while the heat from the hot spot that is closer to the surface has sufficient time to propagate to the surface. Thus, as the frequency is increased, at some point one hot spot does not appear at the top surface of the DUT.

Figure 5A:
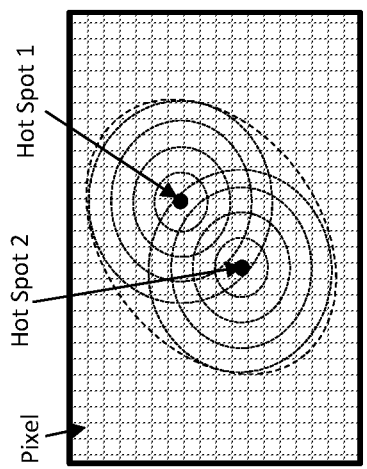
FIGS. 5A to 5D show schematic top views or IR images of another DUT having two closely neighboring hot spots on different layers of the DUT.
Figure 5B:
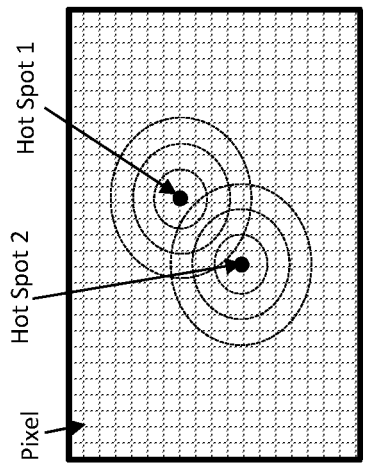
Figure 5C:
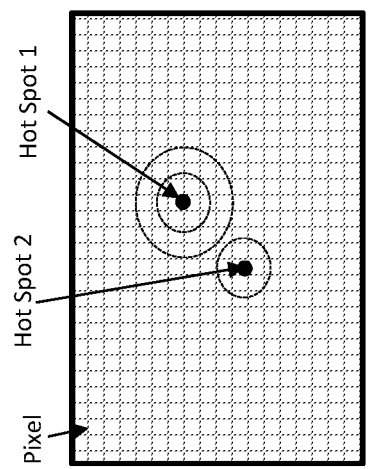
Figure 5D:
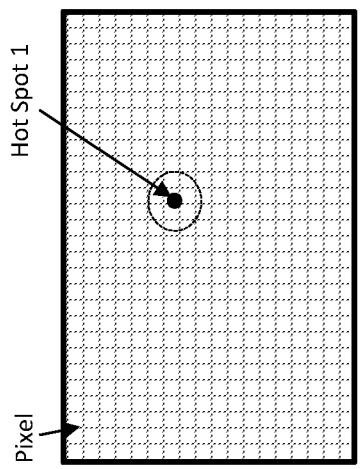

An example of a series of images obtained when the hot spots are at different depth is illustrated in FIGS. 5A-5D. FIG. 5A looks similar to FIG. 4A, since the frequency is low and there's sufficient time for the heat from both hot spots to propagate vertically and spatially such that they appear as unresolvable single hot spot. As the frequency is increased, in FIG. 5B the two hot spots begin to resolve. After further increase in frequency, the signal from hot spot 2 is reduced, since it is deeper than hot spot 1 and has insufficient time to fully propagate to the surface. Indeed, as the frequency is increased again, in FIG. 5D hot spot 2 totally disappeared. Thus, using the disclosed method it was possible to first determine that there are two, not one hot spots, and that one is buried deeper than the other.

For hot spot localization in a multi-layered DUT, a method is provided for localizing hot spots in a multi layered device under test (DUT) by using lock-in thermography (LIT) where plural hot spots of electrical circuits are buried in the DUT at different depth layers from a bottom layer to a top layer, the method comprises applying test signals of multiple frequencies to the electrical circuits of the DUT for exciting the hot spots; imaging a top surface of the top layer of the DUT at timed intervals to obtain IR images of the DUT while the test signal of one of the multiple frequencies is applied to the electrical circuits wherein the images are in correlation to a propagation of heat from the hot spots in the DUT; detecting the thermal response signal at the timed intervals from the images taken from the DUT; and determining changes in the appearance of hot spot images on the top surface of the DUT in relation to the frequencies of the test signals.

As explained above, higher lock-in frequencies result in insufficient time between repeated excitation signals for thermal response to propagate to the top surface of the DUT. Therefore, determining changes in the appearance of hot spot images gives information to the operator useful for the further examination and analysis of the DUT. For example, the further analysis can be restricted to priority evaluations thereby saving testing time.

Determining changes in the appearance of hot spot images comprises one of determining the timing of the disappearance of hot spot images on the surface of the DUT, determining a change of an oval shaped hot spot image generated by at least two laterally closely neighboring hot spots to two separate hot spot images and determining a change of an oval shaped hot spot image generated by at least two laterally closely neighboring hot spots to a separate hot spot image generated by one of the two hot spot.

The changes of the appearance of the images caused by hot spots in a DUT on the top surface of the DUT as discussed with respect to FIGS. 3A to 3C, 4A to 4D, and 5A-5D are displayed on the monitor 20 (FIG. 1) as images of the hot spots on the top surface of the DUT or as a tables showing the timing of the disappearance of the hot spot images on the top surface of the DUT in relation to the frequencies of the test signals. Such a display is possible because the respective data are intermediately stored in the processing unit 18 or, in particular, a storage thereof.

For determining changes in the appearance of hot spot images, a signal-noise ratio of the detected thermal response signals is determined, and the presence of a hot spot is determined where the signal-noise ratio of the thermal response signals is above a predetermined reference value. The image used for the determination is generated from a series of images by continuously generating an average image. According to this process, an image of the surface of the DUT which corresponds to end of a previous timed interval is averaged with an image of the surface of the DUT taken at an end of a subsequent timed interval. As more images are captured, the images are continuously summarized and averaged step by step. Since the response signal stays the same, the noise is canceled out over time by this averaging process. Thus, the resulting image has the best achievable signal to noise ratio, which is used for the determination of the presence of a hot spot.

The image(s) of the hot spot(s) or the timing of the disappearance of hot spot images on the top surface of the DUT in relation to the frequencies of the thermal response signals are displayed to assist the operator in deciding the further analysis of the DUT. For example, several pictures, each taken at different excitation frequency, may be displayed simultaneously to enable the operator to compare the images. This is exemplified in FIG. 1, illustrating several images displayed on the monitor.

The system of FIG. 1 may be used for localizing hot spots in a multi layered device under test (DUT) by using lock-in thermography (LIT) where plural hot spots of electrical circuits are buried in the DUT at different depth layers from a bottom to a top layer, the system comprises an excitation source to apply test signals of multiple frequencies to the electrical circuits of the DUT for exciting the plural hot spots; an infrared camera for imaging a top surface of the top layer of the DUT at timed intervals to obtain IR images of the DUT while the test signal of one of the multiple frequencies is applied to the electrical circuits wherein the images are in correlation to a propagation of heat from the hot spots in the DUT; and a processor configured to receive data from the infrared camera and to use the thermal images of the infrared camera for detecting the thermal response signal at the timed intervals from the images taken from the DUT; and to determine changes in the appearance of hot spot images on the top surface of the DUT in relation to the frequencies of the test signals. It is to be noted that the processor of the system is configured to carry out the above methods of hot spot localization.

In order to further analyze the results of the hot spot localization in multi-layered DUT, further hot spot localization in multi-layered DUT may be carried out as shown in CHRISTIAN SCHMIDT et al and WO 2011/156527 A1 which teach how to derive the depth location of a defect from the frequency vs. phase shift curves.

Figure 6:
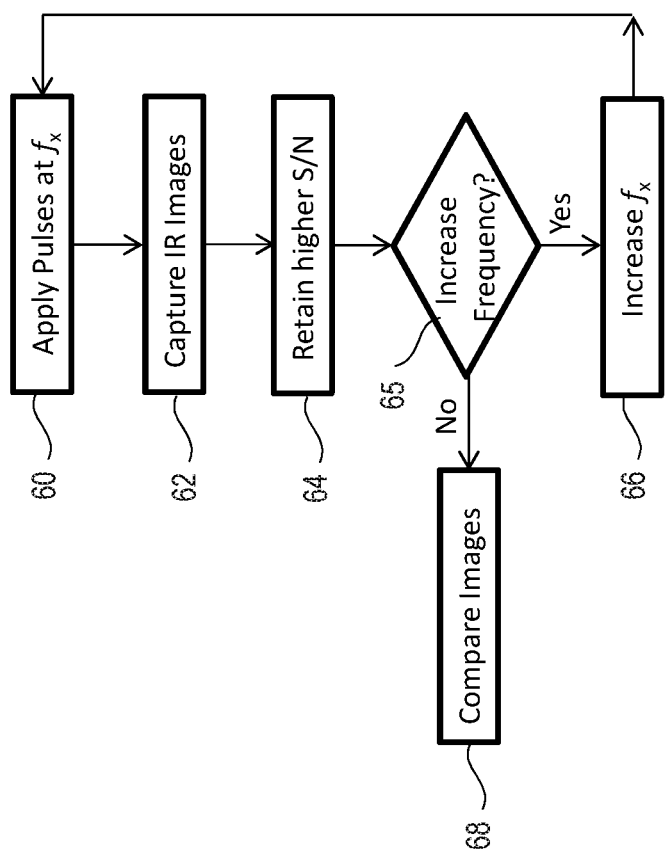
FIG. 6 is a flow chart illustrating steps that may be executed to localize and resolve anomalies in a DUT, according to one embodiment.

FIG. 6 is a flow chart illustrating steps that may be executed to localize and resolve anomalies in a DUT, according to one embodiment. The method of FIG. 6 enables resolving two or more anomalies beyond the optical resolution of the IR camera. In step 60 a test signal is applied to the DUT. The test signal consists of a series of pulses at frequency $f_x$. At step 62, for each pulse of the train of pulses a series of IR images of the DUT is captured. Each successive image in the series replaces the prior image, such that for each pulse the system maintains the image with the highest signal to noise ratio (S/N). The plurality of images of all of the images for the train of pulses are summed up to obtain an image of best S/N, as shown by step 64. In step 65 it is determined whether another series should be captured at a higher frequency $f_x$. If yes, at step 66 the frequency $f_x$ is increased to a new value and the process repeats for the new value of $f_x$. If at step 65 it is determined that no more images are required, the process proceeds to step 68 the images of maximum S/N for all of the frequencies are compared. If the series of images going from lowest frequency to higher frequency show a single hot spot separating into two or more hot spots, it is determined that two or more hot spots are in close proximity on at the same depth inside the DUT. If the series of images going from lowest frequency to higher frequency show two or more hot spots and as the image progress to higher frequency one or more of the hot spots disappear but one or more remain, it is determined that one or more hot spots are in close proximity, but on different depth inside the DUT.

In view of the above, embodiments of the invention include a method for localizing and resolving a plurality of hot spots in an electrical device, comprising: applying to the electrical device a plurality of test signals, each test signal consisting of a train of pulses at a selected frequency, wherein each of the plurality of test signals has different selected frequency; during application of each of the plurality of test signals capturing a plurality of infrared (IR) images; for each of the plurality of test signals selecting at least one plurality of infrared (IR) images as representative image to thereby generate a series of representative images arranged in a progression of increasing selected frequency; and analyzing changes in appearance of each hot spot in the series of representative images along the progression of increasing selected frequency to thereby localize and resolve hot spots within the electrical device. Analyzing changes in appearance includes an image of a single hot spot in one image corresponding to a first selected frequency, and appearing as two hot spots in another image corresponding to a second selected frequency which is higher from the first selected frequency, thereby indicating a plurality of hot spot at similar depth within the electrical device. Analyzing changes in appearance includes an image of a plurality of hot spot in one image corresponding to a first selected frequency, and appearing as fewer hot spots in another image corresponding to a second selected frequency which is higher from the first selected frequency, thereby indicating a plurality of hot spot at different depths within the electrical device. The train of pulses may comprise a square wave signal and the electrical device may comprise an integrated circuit. Capturing a plurality of infrared (IR) images may include obtaining a sync signal corresponding to the selected frequency. Each representative image may be an image having the highest signal to noise ratio.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. It is intended that the specification and examples be considered as exemplary only, with a true scope of the invention being indicated by the following claims.

The invention claimed is:

1. A method comprising:
   applying test signals to a device under test (DUT), at least two of the test signals being applied at a different excitation frequency;
   acquiring a plurality of infrared (IR) images of the DUT, each IR image of the plurality of IR images being associated with a respective lock-in frequency; and determining whether a single spot in a first IR image separates into multiple spots in a second IR image, the first and second IR images being associated with a different respective lock-in frequency.

2. The method of claim 1, wherein the first IR image is obtained with a first respective lock-in frequency and the second IR image is obtained with a second respective lock-in frequency, the first respective lock-in frequency being lower than the second respective lock-in frequency.

3. The method of claim 1, further comprising:
determining whether two spots are at different depths based on disappearance of one of the spots in successive IR images.

4. The method of claim 3, wherein successive images of the plurality of IR images have increasing associated lock-in frequencies.

5. The method of claim 1, wherein the determining whether the single spot in the first IR image separates into multiple spots in the second IR image comprises:
determining changes in at least the first and second IR images in relation to their respective associated lock-in frequencies.

6. The method of claim 1, wherein the determining whether the single spot in the first IR image separates into multiple spots in the second IR image comprises:
determining changes in the plurality of IR images in relation to their respective associated lock-in frequencies.

7. The method of claim 1, further comprising:
comparing successive IR images of the plurality of IR images; and
determining a disappearance of one or more spots with increasing associated lock-in frequencies, wherein the disappearance of the one or more spots indicates a depth relationship between the one or more spots.

8. The method of claim 1, further comprising:
determining whether at least one of the multiple spots in the second IR image disappears in a third IR image, the third IR image being associated with a different at least one of the lock-in frequencies than the first IR image and the second IR image.

9. The method of claim 1, further comprising:
generating an average image by averaging at least two of the plurality of IR images, the at least two of the plurality of IR images being associated with the same at least one of the associated lock-in frequencies;
wherein the average image is used as the first IR image or the second IR image.

10. The method of claim 1, further comprising:
comparing signal to noise ratios of at least two of the plurality of IR images that are associated with a same lock-in frequency; and
based on the comparing, selecting an image of the at least two of the plurality of IR images;
wherein the selected image is used as the first IR image or the second IR image.

11. The method of claim 1, wherein at least one of the test signals comprises a train of electrical pulses at the at least one of the respective excitation frequenc(ies) of the test signals.

12. The method of claim 1, further comprising:
based on the determining, storing data in a non-transitory computer-readable storage medium indicating at least one of: a location in the DUT of the single spot or at least one of the multiple spots, a depth in the DUT of the single spot or at least one of the multiple spots, a layer in the DUT of the single spot or at least one of the multiple spots, a circuit element that causes a defect associated with the spot, a layered structure that causes a defect associated with the spot a priority of further evaluations of the DUT, a layer to remove from the DUT, how to remove layers of the DUT, or a side of the DUT to start removing a layer.

13. The method of claim 1, further comprising:
modifying the DUT by performing at least one of the following operations based on the determining: removing a layer of the DUT, removing portions of a layered structure of the DUT, removing a circuit element of the DUT, modifying a circuit element of the DUT, or exposing a portion of the DUT associated with the single spot or at least one of the multiple spots.

14. A system comprising:
an excitation source situated to produce excitation signals having at least two different excitation frequencies;
an infrared (IR) camera situated to produce IR images by imaging a device under test (DUT) that is stimulated using the excitation signals produced by the excitation source;
a processor configured to associate the IR images with a respective lock-in frequency; and
the processor configured to identify a single hot spot that appears in a first set of the IR images that appears as a plurality of hot spots in a second set of the IR images, the second set of the IR images being associated with a different respective lock-in frequency than the first set of the IR images.

15. The system of claim 14, wherein the second set of the IR images is produced by stimulating the DUT using excitation signals having different excitation frequencies than used to stimulate the DUT to produce the first set of the IR images.

16. The system of claim 14, wherein the second set of the IR images is associated with a higher respective lock-in frequency than the respective lock-in frequency associated with the first set of the IR images.

17. The system of claim 14, wherein the second set of the IR images is produced with a higher respective one of the excitation frequencies than a respective excitation frequency used to produce the first set of the IR images.

18. The system of claim 14, wherein the processor is further configured to:
determine whether at least two of the plurality of hot spots are at different depths based on disappearance of one of the plurality of hot spots in successive images of the IR images.

19. The system of claim 14, wherein the processor is further configured to identify the single hot spot by: determining changes in at least the first set of the IR images and the second set of the IR images in relation to their respective associated lock-in frequencies.

20. The system of claim 14, wherein the processor is further configured to identify the single hot spot by:
comparing successive images of the IR images; and
determining a timing of disappearance of at least one of the plurality of hot spots with increasing associated lock-in frequency, wherein the timing of disappearance of the at least one of the plurality of hot spots indicates a depth relationship between the at least one of the plurality of hot spots and another at least one of the plurality of hot spots.

21. The system of claim 14, wherein the processor is further configured to:

generate an average image by averaging at least two of the IR images, the at least two of the IR images being associated with the same lock-in frequency;
wherein the first set of the IR images or the second set of IR images consists of the average image.

22. The system of claim 14, wherein the processor is further configured to:
compare signal to noise ratios of at least two of the IR images, the at least two of the IR images being associated with the same lock-in frequency; and
based on the comparing, select an image of the at least two of the IR images;
wherein the first set of the IR images or the second set of IR images consists of the selected image.

23. A method of identifying a defect in a device under test (DUT), the method comprising:
by a processor, determining whether a single spot in a first infrared (IR) image separates into multiple spots in a second IR image, each of the first IR image and the second IR image being associated with a different lock-in frequency, the first IR image and the second IR image having been generated by:
applying test signals to the DUT using at least two different excitation frequencies, and
during the applying the test signals, acquiring a plurality of IR images of the DUT, the plurality of IR images comprising the first IR image and the second IR image.

24. The method of claim 23, further comprising:
determining whether two spots of the multiple spots are at different depths based on disappearance of one of the two spots in successive IR images.

25. The method of claim 23, wherein the determining whether the single spot in the first IR image separates into multiple spots in the second IR image comprises:
determining changes in the plurality of IR images in relation to their respective associated lock-in frequencies.

26. The method of claim 23, further comprising:
comparing successive IR images of the plurality of IR images; and
determining a disappearance of one or more spots with increasing associated lock-in frequencies, wherein the disappearance of the one or more spots indicates a depth relationship between the one or more spots.

27. The method of claim 23, further comprising:
determining whether at least one of the multiple spots in the second IR image disappears in a third IR image, the third IR image being associated with a different at least one of the lock-in frequencies than the first IR image and the second IR image.

28. The method of claim 23, wherein:
the first IR image is obtained using its respective associated lock-in frequency and the second IR image is obtained using different respective lock-in frequency.

29. The method of claim 23, further comprising:
based on the determining, storing data in a non-transitory computer-readable storage medium indicating at least one of: a location in the DUT of the single spot or at least one of the multiple spots, a depth in the DUT of the single spot or at least one of the multiple spots, a layer in the DUT of the single spot or at least one of the multiple spots, a circuit element that causes a defect associated with the spot, a layered structure that causes a defect associated with the spot a priority of further evaluations of the DUT, a layer to remove from the DUT, how to remove layers of the DUT, or a side of the DUT to start removing a layer.

30. A non-transitory computer-readable storage media storing computer-executable instructions, which when executed by a processor of a central processing unit, cause the central processing unit to perform a method of identifying a defect in a device under test (DUT), the method comprising:
by the processor, determining whether a single spot in a first infrared (IR) image separates into multiple spots in a second IR image, each of the first IR image and the second IR image being associated with a different lock-in frequency, the first IR image and the second IR image having been generated by:
applying test signals to the DUT using at least two different excitation frequencies, and
during the applying the test signals, acquiring a plurality of IR images of the DUT, the plurality of IR images comprising the first IR image and the second IR image.

31. The non-transitory computer-readable storage media of claim 30, wherein the method further comprises:
determining whether two spots of the multiple spots are at different depths based on disappearance of one of the two spots in successive IR images.

32. The non-transitory computer-readable storage media of claim 30, wherein the determining whether the single spot in the first IR image separates into multiple spots in the second IR image comprises:
determining changes in the plurality of IR images in relation to their respective associated lock-in frequencies.

33. The non-transitory computer-readable storage media of claim 30, wherein the method further comprises:
comparing successive IR images of the plurality of IR images; and
determining a disappearance of one or more spots with increasing associated lock-in frequencies, wherein the disappearance of the one or more spots indicates a depth relationship between the one or more spots.

34. The non-transitory computer-readable storage media of claim 30, wherein the method further comprises:
determining whether at least one of the multiple spots in the second IR image disappears in a third IR image, the third IR image being associated with a different at least one of the lock-in frequencies than the first IR image and the second IR image.

35. The non-transitory computer-readable storage media of claim 30, wherein the first IR image is obtained using its respective associated lock-in frequency and the second IR image is obtained using different respective lock-in frequency.

36. The non-transitory computer-readable storage media of claim 30, wherein the method further comprises:
based on the determining, storing data in a non-transitory computer-readable storage medium indicating at least one of: a location in the DUT of the single spot or at least one of the multiple spots, a depth in the DUT of the single spot or at least one of the multiple spots, a layer in the DUT of the single spot or at least one of the multiple spots, a circuit element that causes a defect associated with the spot, a layered structure that causes a defect associated with the spot a priority of further evaluations of the DUT, a layer to remove from the DUT, how to remove layers of the DUT, or a side of the DUT to start removing a layer.

* * * * *

UNITED STATES PATENT AND TRADEMARK OFFICE
CERTIFICATE OF CORRECTION

PATENT NO. : 11,022,646 B2  
APPLICATION NO. : 16/716370  
DATED : June 1, 2021  
INVENTOR(S) : Schmidt Page 1 of 1

It is certified that error appears in the above-identified patent and that said Letters Patent is hereby corrected as shown below:

In the Claims

Column 12,
Line 4, "the spot a priority" should be --the spot, a priority--

Column 13,
Line 62, "the spot a priority" should be --the spot, a priority--

Column 14,
Line 59, "the spot a priority" should be --the spot, a priority--

Signed and Sealed this
Tenth Day of October, 2023

Katherine Kelly Vidal
*Director of the United States Patent and Trademark Office*